United States Patent
Tran et al.

(10) Patent No.: US 6,832,174 B2
(45) Date of Patent: Dec. 14, 2004

(54) METHOD AND APPARATUS PROVIDING INTERLEAVED DATA FROM MULTIPLE SIGNAL ACQUISITION DEVICES

(75) Inventors: Que Thuy Tran, Beaverton, OR (US); David L. Kelly, Portland, OR (US); Douglas A. Blegen, Aloha, OR (US)

(73) Assignee: Tektronix, Inc., Beaverton, OR (US)

( * ) Notice: Subject to any disclaimer, the term of this patent is extended or adjusted under 35 U.S.C. 154(b) by 64 days.

(21) Appl. No.: 10/322,260

(22) Filed: Dec. 17, 2002

(65) Prior Publication Data

US 2004/0117143 A1 Jun. 17, 2004

(51) Int. Cl.[7] .............................................. G06F 11/30
(52) U.S. Cl. ................................... 702/121; 324/76.38
(58) Field of Search ........................ 702/121, 66, 125, 702/117; 324/76.11, 76.24, 76.38, 76.42

(56) References Cited

U.S. PATENT DOCUMENTS

| | | | | |
|---|---|---|---|---|
| 3,913,021 A | * | 10/1975 | McCarthy et al. | 327/149 |
| 4,209,843 A | * | 6/1980 | Hyatt | 708/422 |
| 4,807,147 A | * | 2/1989 | Halbert et al. | 702/66 |
| 5,578,917 A | * | 11/1996 | Bottman | 324/76.15 |
| 5,929,838 A | * | 7/1999 | Hall | 345/440.1 |
| 5,942,927 A | * | 8/1999 | Etheridge et al. | 327/158 |
| 5,999,163 A | * | 12/1999 | Ivers et al. | 345/208 |
| 6,219,029 B1 | * | 4/2001 | Flakne et al. | 345/690 |
| 6,407,686 B1 | * | 6/2002 | Otani et al. | 341/120 |
| 6,564,160 B2 | * | 5/2003 | Jungerman et al. | 702/106 |
| 6,615,148 B2 | * | 9/2003 | Pickerd | 702/66 |
| 6,677,577 B2 | * | 1/2004 | Otani et al. | 250/227.14 |
| 6,693,576 B2 | * | 2/2004 | Azinger | 341/155 |

* cited by examiner

*Primary Examiner*—Edward Raymond
(74) *Attorney, Agent, or Firm*—Thomas F. Lenihan; Moser, Patterson & Sheridan LLP; Francis I. Gray (57) ABSTRACT

A system comprising a plurality of digital storage oscilloscopes (DSOs) in which each DSO acquires a common signal under test (SUT) according to respective clock signals having common frequency parameters and respective phase parameters such that a plurality of acquisition records may be interleaved to produce a higher effective resolution acquisition record.

18 Claims, 4 Drawing Sheets

METHOD AND APPARATUS PROVIDING INTERLEAVED DATA FROM MULTIPLE SIGNAL ACQUISITION DEVICES

CROSS REFERENCE TO RELATED APPLICATIONS

This application is related to co-pending, commonly assigned, U.S. patent applications Ser. No. 10/322,191 and Ser. No. 10/323,503, which applications are incorporated herein by reference.

FIELD OF THE INVENTION

The invention relates generally to signal analysis instruments and, more specifically, to a method and apparatus for combining data from multiple signal acquisition devices.

BACKGROUND OF THE INVENTION

Signal acquisition devices such as digital storage oscilloscopes (DSOs) and the like typically include a limited number of input channels and a limited amount of memory for storing data acquired from the various input channels. This limitation in acquisition memory reduces the size of the acquisition record(s) produced by a DSO. Additionally, advances in acquisition rates provide the ability to generate increasingly larger acquisition records in shorter periods of time, further exacerbating memory limitation problems. While this problem may be reduced by increasing the amount of memory within a DSO, such increase in memory is not without cost. Moreover, the actual amount of memory increase to be provided is inherently dependent upon the application to which the DSO is used. Thus, a very high memory/high capability DSO may provide a level of functionality far greater than necessary for most of the applications to which it is used.

SUMMARY OF INVENTION

These and other deficiencies of the prior art are addressed by the present invention. Specifically, in an embodiment of the invention, the acquisition records of several signal acquisition devices such as oscilloscopes are combined to create a single acquisition record. By controlling the phase of acquisition clocks within the various acquisition devices, and triggering the devices in a synchronized manner, the resulting acquisition records from the respective devices may be interleaved to effectively multiply the sample rate of a commonly sampled signal(s). In this manner, practical limitations regarding the amount of acquisition memory deployed within a single acquisition device and a desire to obtain more detailed measurements of a given signal are realized. Thus, a plurality of more standardized signal acquisition devices may be grouped together to achieve a higher level of functionality at a reduced cost.

BRIEF DESCRIPTION OF THE DRAWINGS

The teachings of the present invention can be readily understood by considering the following detailed description in conjunction with the accompanying drawings, in which.

DETAILED DESCRIPTION OF THE INVENTION

The subject invention will be primarily described within the context of test and measurement devices such as a plurality of digital storage oscilloscopes (DSOs). However, it will be appreciated by those skilled in the art that the invention may be advantageously employed in any environment where multiple signal analysis devices having respective triggering functions or trigger event decoding functions (e.g., logic analyzers) are desired to process signals under test.

In the systems described herein, the acquisition records of several signal acquisition devices such as oscilloscopes are combined to create a single acquisition record. By controlling the phase of acquisition clocks within the various acquisition devices, and triggering the devices in a synchronized manner, the resulting acquisition records from the respective devices may be interleaved to effectively multiply the sample rate of a commonly sampled signal(s).

Figure 1:
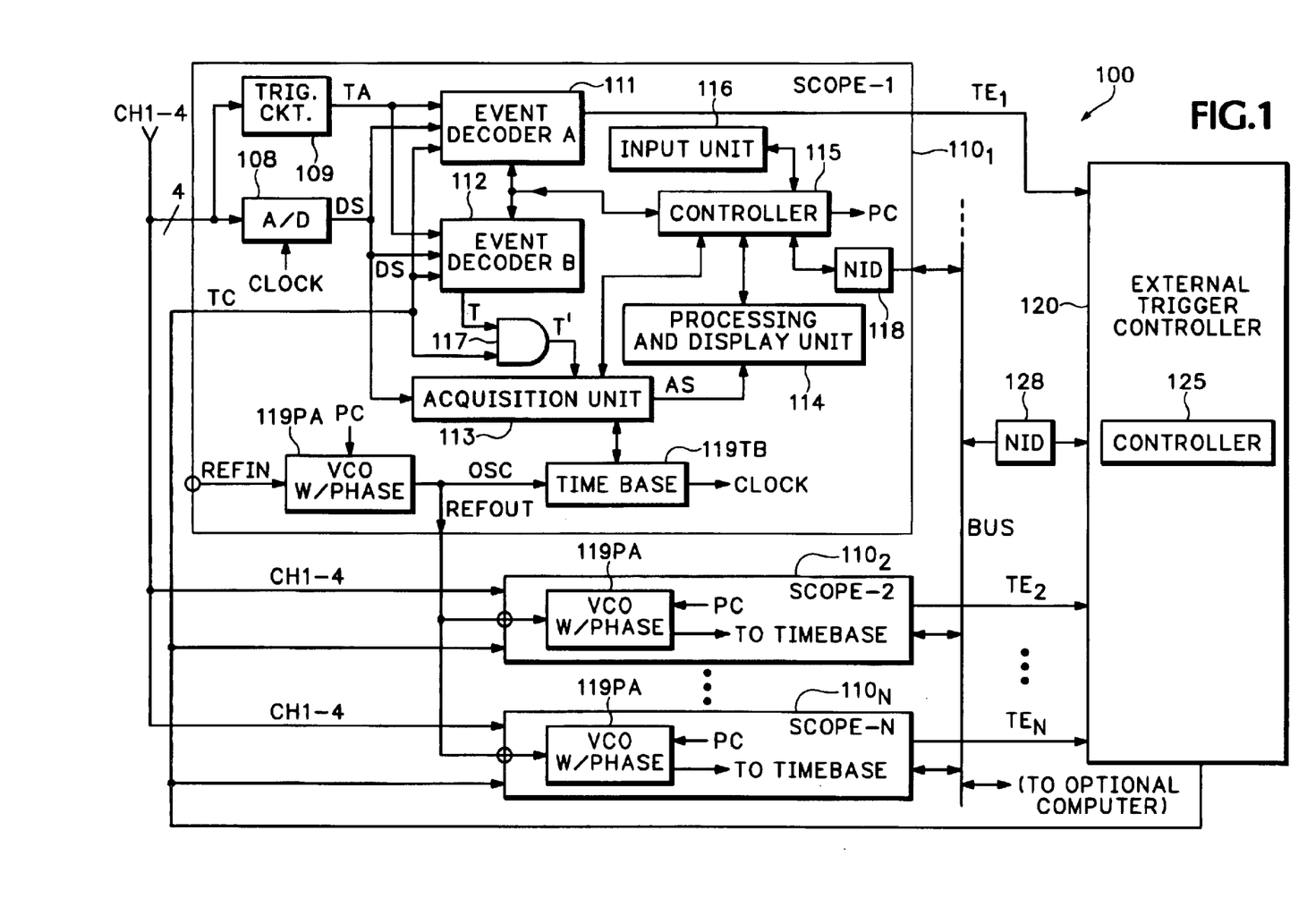
FIG. 1 depicts a high-level block diagram of a signal analysis system according to an embodiment of the invention.

FIG. 1 depicts a high-level block diagram of a signal acquisition system according to an embodiment of the present invention. Specifically, the system 100 of FIG. 1 comprises a plurality of signal or data acquisition devices (i.e., test and measurement instruments) such as digital storage oscilloscopes (DSOs), logic analyzers and the like denoted as acquisition devices $110_1$, $110_2$, and so on up to $110_N$ (collectively acquisition devices 110). Each of the acquisition devices 110 comprises, illustratively, a four channel DSO, though more or fewer channels may be used for any or all of the acquisition devices 110. Moreover, more or fewer acquisition devices may be used and, in various embodiments, different types of acquisition devices may be used.

Each of a first acquisition device $110_1$, a second acquisition device $110_2$ and so on up to an $N^{th}$ acquisition device $110_n$ receives data from the same, illustratively, four respective input channels CH1–4. Each of the acquisition devices 110 comprises a first event decoder 111, a second event decoder 112, an acquisition unit 113, a processing and display unit 114, a controller 115, an input unit 116, an optional trigger logic unit 117, an optional network interface device (NID) 118, a time base 119 TB and a time base phase adjustment unit 119PA (illustratively a voltage controlled oscillator (VCO) having a phase adjustment capability).

Assuming a four channel DSO embodiment, and referring to first acquisition device $110_1$, each of the, illustratively, four input signals under test (SUT) is digitized and coupled to the first event decoder 111, second event decoder 112 and acquisition unit 113. A digitizer (A/D converter) 108 receives the analog signals under test and responsively provides digitized samples (DS) to the event decoders 111, 112 and acquisition unit 113 at a sample time and rate determined by a clock signal CLOCK. In addition, an analog trigger circuit 109 receives the analog signals under test and responsively provides a trigger output signal TA to the first 111 and second 112 event decoders upon detection of a preselected analog signal condition. Such analog signal conditions may include detection of rising edge, falling edge, pulsewidth, period, glitch, and runt, to name but a few. The analog trigger circuit 109 is optionally controlled (e.g. selection of analog signal condition, trigger logic and the like) by the controller 115.

The acquisition unit 113 comprises, illustratively, at least one decimator for each of the four input signals as well as supporting acquisition memory. The acquisition unit 113 is responsive to a trigger signal provided by the second event decoder 112 to produce an acquired sample stream AS suitable for use by the processing and display unit 114. The trigger signal may be provided directly by the second event decoder 112 or via the optional trigger logic unit 117 as optional trigger signal T'. That is, the trigger signal T provided by the second event decoder 112 may be further processed using the trigger logic unit 117 (e.g., a sequential or combinational logic processing unit). The acquisition unit 113 is optionally responsive to the controller 115 to change decimator functions, memory allocations and other functions as appropriate, and as appreciated by those skilled in the art informed by the present disclosure. The acquisition unit may also communicate acquired data, such as the acquired sample stream AS, to the controller 115 for processing or further communication to other devices via the optional NID 118.

The processing and display unit 114 comprises, illustratively, a display device (not shown) and associated data processing circuitry suitable for converting the acquired sample stream AS into visual imagery. The processing and display unit 114 is responsive to the controller 115 to set various parameters such as volts per division, time scale and the like. It will be appreciated by those skilled in the art that within the context of a data acquisition system utilizing many acquisition devices 110, it is not necessary to include a processing and display unit 114 in each of the acquisition devices. Moreover, in the case of acquisition devices 110 comprising modules or cards inserted within a computing device or arranged using a back plane, a single processing and display unit 114 may provide an image processing function for any one (or more) of the acquisition devices 110.

The input unit 116 comprises a keypad, pointing device or other means adapted to provide user input to the controller 115. The controller 115, in response to such user input, adapts the operations of the data acquisition unit 110 to perform various data acquisition, triggering, processing, display and other functions. In addition, user input may be used to trigger automatic calibration functions and/or adapt other operating parameters of a DSO, logic analysis or other data acquisition device. Such input may also be provided to the controller 115 via a communications link operably coupled to the optional NID 118.

It will be appreciated by those skilled in the art that standard signal processing components (not shown) such as signal buffering circuitry, signal conditioning circuitry and the like are also employed as appropriate to enable the various functions described herein. For example, the digitized input signals CH1–4 are sampled at a sufficiently high rate to enable appropriate processing by the various event decoders 111, 112 and acquisition unit 113.

The first event decoder 111 processes one or more of the digitized input channel data streams according to a combinational and/or sequential logic function to determine whether a predefined triggering condition exists. For example, the first event decoder 111 may be programmed by the controller 115 to examine all or some of the four digitized input channels data streams to determine whether a triggering event such as a desired sequence of logic levels indicative of a portion of a data word or the like has been received. As noted above, first event decoder 111 also receives an analog trigger signal TA from analog trigger circuit 109. In response to the determination or decoding of a desired triggering event(s), a trigger enable signal TE is generated. Each of the acquisition devices $110_1$ through $110_n$ produces a respective trigger signal $TE_1$ through $TE_N$. Each of the produced trigger signals $TE_1$ through $TE_N$ is coupled to an external trigger controller 120. Thus, logical event indicative signals associated with each (or at least some) of the input signals are provided to the external trigger controller 120 for further processing.

The external trigger controller 120 processes the received trigger signals $TE_1$ through $TE_N$ to determine whether a desired combined trigger condition is met. Such processing may comprise any combinational and/or sequential logic processing of the trigger signals, such as conventional logic processing (AND NAND, XOR, etc.). In response to the satisfaction of the desired combined trigger condition, the external trigger controller 120 produces a trigger control signal $T_c$ having a defined state, logic level, waveform and the like which is coupled to one or more of the data acquisition devices 110. The external trigger controller 120 is depicted as including a controller 125. The controller 125 may implement any combinational or sequential logic processing operation desired. Moreover, the controller 125 may communicate with the optional communications bus via an optional NID 128. It is noted that the external trigger controller 120 may comprise a single ASIC programmed to perform the specific combinational/sequential logic function of combining the various trigger enable inputs $TE_1$ through $TE_N$ to produce the trigger control signal $T_C$.

The trigger control signal $T_C$ is received at one or both of the first 111 and second 112 event decoders within an acquisition device 110. The second event decoder 112 is responsive to the decoding or detection of a triggering event based upon the sequential or combinational state of its respective input channels as well as detection of analog signal conditions. In response to the sequential or combinational state of the trigger control signal $T_C$, the second event decoder produces the trigger signal T used to control the acquisition unit 113.

The phase adjustable oscillator 119 PA produces an oscillation or clock signal OSC which is provided to the time base 119TB. The time base 119TB utilizes the oscillation signal OSC to derive therefrom various timing signals (some of which are not shown) used within the signal acquisition device 110. One such derived timing signal comprises a clock signal CLOCK, which is coupled to the A/D converter 108 as the sample clock signal. The A/D converter 108, in response to at least one of a positive edge, negative edge, positive level and negative level of the clock signal CLOCK, samples one or more of the analog signals under test provided via the CH1–4 inputs to produce thereby output samples.

The phase adjustable oscillator 119PA is optionally responsive to a phase control signal PC produced by, for example, the controller 115. Referring to the first signal acquisition device $110_1$, it is noted that a reference input REFIN is not connected to an external reference source. Thus, in this embodiment, the phase adjustable oscillator operates at a predetermined frequency to produce its oscillatory output signal OSC. It is also noted that this oscillatory output signal OSC is coupled to a reference output port denoted as REFOUT, such that the oscillatory OSC may be propagated to each of the remaining two $110_2$ through N $110_N$ signal acquisition devices. In this manner, operation of each of the phase adjustable oscillators 119PA within the various signal acquisition devices 110 may be synchronized.

By operating the various signal acquisition devices $110_1$ through $110_N$ in a synchronized manner using a common oscillation signal, the respective time base 119TB and A/D converter 108 elements within the signal acquisition devices 110 may be synchronized. Further, by triggering the various signal acquisition devices $110_1$ through $110_N$ in a synchronized manner using the trigger control signal $T_C$ produced by the external trigger controller 120, the acquisition units 113 of the signal acquisition devices 110 may also be controlled in a synchronous manner.

To increase the effective number of samples associated with the signal acquisition function of the system 100 of FIG. 1, each of the phase adaptive oscillators 119PA within the various signal acquisition devices 110 cause their respective time base modules 119TB to operate at slightly different times. For example, assuming that four signal acquisition devices 110 are used (i.e., N=4), then each of the four signal acquisition devices is operated using a clock signal CLOCK that is 90° (i.e., $\pi/2$) out of phase with respect to the clock signal of an adjoining signal acquisition device 110. This embodiment will be discussed in more detail below with respect to FIG. 3.

The system 100 of FIG. 1 provides for a plurality of data acquisition devices 110, where each acquisition device provides a respective trigger signal determined according to the decoding or detection of sequential and/or logical conditions of its respective input channels. The external trigger controller 120 aggregates or combines the trigger events $TE_1$ through $TE_N$ produced by the data acquisition units $110_1$ through $110_N$ produce a combined trigger control signal $T_C$. The combined trigger control signal $T_C$ is then used by each of the data acquisition units 110 to control its respective acquisition function. In this manner, a trigger condition having sequential or combinational logic characteristics that exceed the capabilities of any one instrument, such as a DSO or other data acquisition device is realized. For example, a user may suspect that his system under test may be experiencing problems only under certain conditions. In this example those conditions are a "runt" (i.e., less than full amplitude) signal occurring when his eight data lines are in the state 10100101. Thus, the user will preprogram external trigger controller 120 to generate a combined trigger only when both of the above conditions are true. Note that all eight data lines (four from each of two oscilloscopes) are logically combined and further combined with the detection of an analog trigger condition (i.e., runt), an outcome heretofore not possible.

Where each of a plurality of acquisition devices 110 utilizes a similar gated triggering mechanism, each of the respective acquisition units 113 of the acquisition devices 110 will be triggered at the same time and in response to the same decoded event. This is useful since each instrument or acquisition device 110 may take acquisition at different times if the combined trigger event rate is higher than the slowest acquisition rate since record length, hold off time, processing time and the like may be different such that each instrument or acquisition device 110 is ready for the trigger condition at different times. By utilizing the sequential triggering mechanism enabled by the trigger logic unit 117, each instrument or acquisition device 110 sends its decoded trigger event (from its first event decoder 111) only when it is ready to trigger. In this manner, the resulting combined event or triggering condition provided by the external trigger controller 120 occurs only when all acquisition devices 110 are ready to trigger. Thus, when the combined triggering event occurs, all acquisitioning devices will trigger on the particular event. When any one instrument or acquisition device 110 is triggered, it will go back to a "not ready to trigger" state to mask out the decoded event to the external trigger controller 120. Therefore, each of the instruments or acquisition devices 120 will then wait for all of the instruments or acquisition devices to do their respective post-acquisition processing functions prior to the start of the next acquisition cycle.

In one embodiment of the invention, an optional network interface device (NID) 118 is used to enable communications between acquisition devices 110 and/or a computer (not shown), such as a personal computer, work station or other computing device including standard components such as keyboard entry means, processing means, display means, memory, input/output and the like. Such a computer may perform part of an automatic test system or data acquisition and processing system. The network interface device 118 enables the controller 115 of an acquisition device 110 to coordinate desired triggering events, presentations of acquired data, acquisition of data and other operating parameters. Additionally, in an embodiment where each of the acquisition devices comprises a card or sub-assembly within a larger acquisition device, a control bus BUS cooperating with network interface devices within each of the acquisition devices 110 enables the optional computer to set the various operational parameters of the acquisition devices and retrieve acquired data from the acquisition devices for subsequent presentation on a display device associated with the optional computer, for data analysis or other applications. The computer and/or acquisition devices 110 may also optionally communicate with a controller 125 within the external trigger controller 120. In this manner, full automation and control of the various acquisition devices 110, external trigger controller 120 and other devices (not shown) communicating via the control bus BUS may be provided. This embodiment of the invention works well for individual acquisition devices, such as a plurality of test or measurement instruments (e.g., digital signal oscilloscopes, logic analyzers and the like) or acquisition modules within an acquisition system or computer.

A DSO or other data acquisition device 110 according to an embodiment of the invention includes a triggering system having the ability to deliver a trigger enable signal TE or other indicium of a decoded or detected triggering event to an external trigger controller independent of the event that it is used to trigger the DSO. Thus, in the data acquisition units 110 of FIG. 1, first 111 and second 112 event decoders are used. The first event decoder 111 is adapted to decode or otherwise determine that a triggering event has occurred and, further, to provide indicium of that triggering event to the external trigger controller 120. The second event decoder 112 preferably decodes or determines the occurrence of the same triggering event and responsively produces a triggering signal T adapted to control the acquisition unit 113.

The combined triggering event enabled by the invention may be used to trigger each of the multiple instruments and, thereby, synchronize operation of the instruments. In an alternate embodiment of the invention, acquisition times between instruments having different operational parameters (e.g., acquisition speed, acquisition rate, record length, hold-off time, processing time and the like) are adapted to enable a relatively synchronized data acquisition process across multiple instrument platforms such that resulting acquired data from the various channels in the various instruments may be usefully synchronized and otherwise processed.

Figure 2:
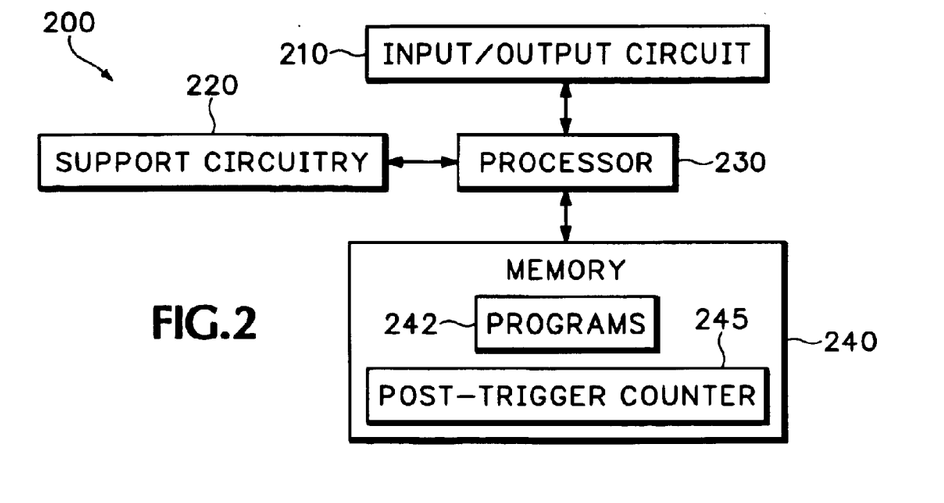
FIG. 2 depicts a high-level block diagram of a controller suitable for use in the signal analysis system of FIG. 1.

FIG. 2 depicts a high level-block diagram of a controller suitable for use in a signal analysis system of FIG. 1. Specifically, the controller 200 of FIG. 2 may be employed to implement functions of the controller 115 in an acquisition device 110 and/or the controller 125 in an external trigger controller 120. The controller 200 of FIG. 2 comprises a processor 230 as well as memory 240 for storing various control programs and other programs 242, as well as a post-trigger counter 245. The post-trigger counter 245 comprises a software or hardware counting element that is used to define a temporal offset between the combined triggering event and the beginning of an acquisition record (AR). The processor 230 cooperates with conventional support circuitry 220 such as power supplies, clock circuits, cache memory and the like as well as circuits that assist in executing the software routine stored in the memory 240. As such, it is contemplated that some of the steps discussed herein as software processes may be implemented within hardware, for example as circuitry that cooperates with the processor 230 to perform various steps. The controller 200 also contains input/output (I/O) circuitry 210 that forms an interface between the various functional elements communicating with the controller. Although the controller 200 of FIG. 2 is depicted as a general purpose computer that is programmed to perform various control functions in accordance with the present invention, the invention can be implemented in hardware as, for example, an application specific integrated circuit (ASIC). As such, the process steps described herein are intended to be broadly interpreted as being equivalently performed by software, hardware or a combination thereof.

In one embodiment of the invention, a computing device such as a personal computer (PC) receives signal acquisition devices in each of a plurality of internal slots within an external assembly (e.g., a "rack" of test and measurement devices) in communication with the PC. The computing device also includes an external trigger controller in an additional slot, or performs a logical operation that replicates the function of the previously described external trigger controller. It will be noted that the term "slot" is to be broadly construed as any means of electrical and/or mechanical communication of a signal acquisition device or test and measuring device with the PC. Moreover, the PC discussed herein is to be broadly construed as any computing device or platform having comparable functions, such as an Apple® Macintosh® computer, Sun Microsystems® computing platform and the like. It will be further appreciated that the paths used to route trigger enable and/or trigger control signals between the various components (e.g., scopes 110 and trigger controller 120) may be formed using discrete wiring between the various components or via the bus architecture associated with the PC.

Figure 3:
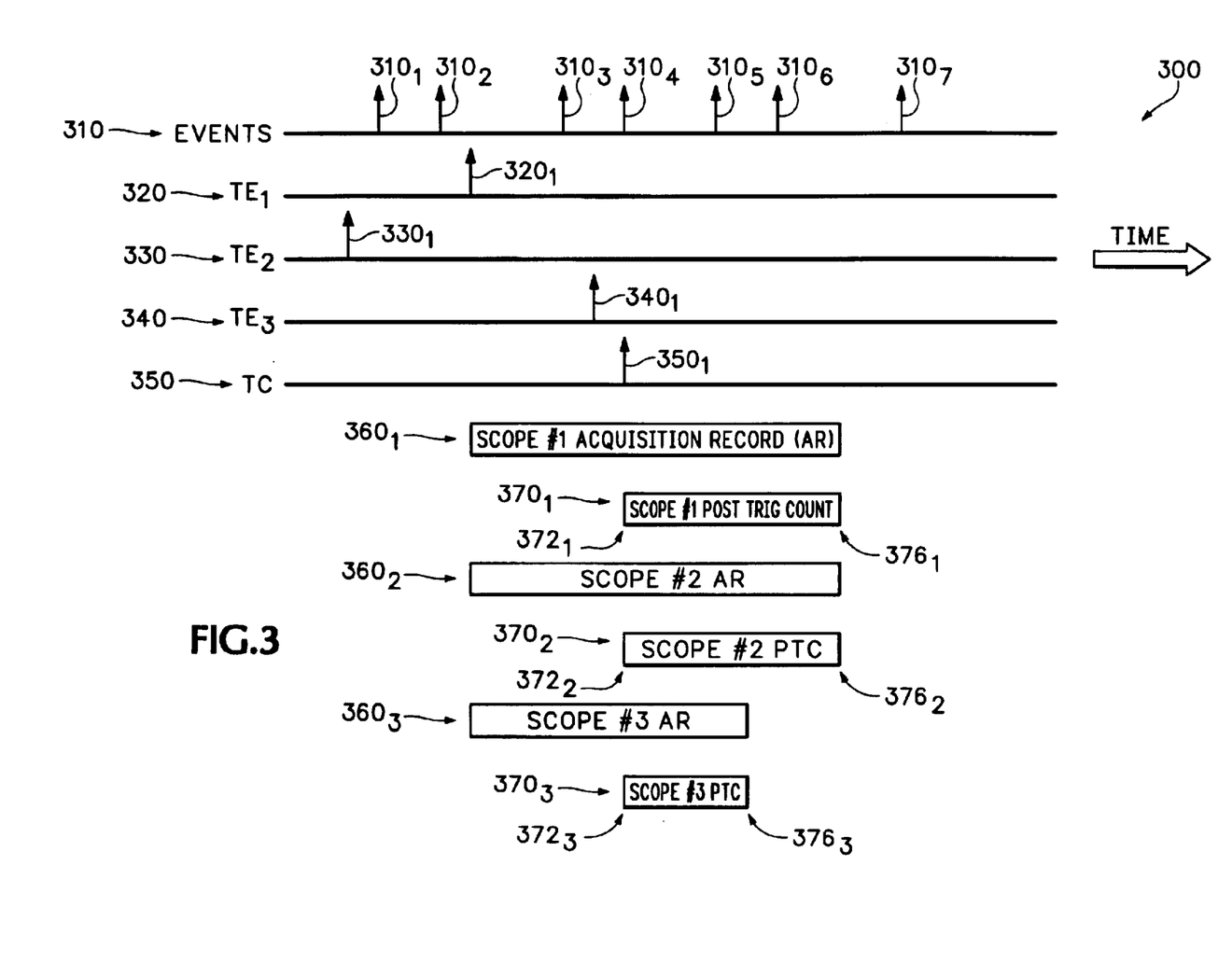
FIG. 3 depicts a composite timing diagram useful in understanding the present invention.

FIG. 3 depicts a composite timing diagram useful in understanding the present invention. Specifically, the composite timing diagram 300 of FIG. 3 depicts a plurality of temporally aligned time lines, where each time line represents one of a triggering event (310), a trigger enable signal produced by a test and measurement device (time lines 320, 330 and 340), a trigger control signal produced by an external trigger controller (350), a respective utilization of an acquisition memory to produce an acquisition record (360) and a time period following a trigger control assertion during which an acquisition record is formed (370).

While the composite timing diagram 300 of FIG. 3 is depicted for a system 100 comprising three signal analysis devices (i.e., N=3), it will be appreciated by those skilled in the art that the composite timing diagram 300 may be adapted to include more or fewer signal acquisition devices. Moreover, it will be noted that the acquisition memory size for acquisition records generated and acquisition memory do not necessarily need to be of the same length, as depicted by the size differences of a third acquisition record $360_3$ when compared to a first $360_1$ and second $360_2$ acquisition records. However, it is preferred that the interleaving of data be performed using acquisition record portions of substantially similar length. Therefore, it is preferred that the shortest acquisition record capable of being acquired comprise the maximum length of any acquisition record including data to be interleaved. While this preferred embodiment will generate more accurate data than the use of uneven record lengths, the use of such unequal record lengths will also provide useful data and may be appropriate in some circumstances.

The invention operates to synchronize the triggering of each of a plurality of test and measurement devices 110. Each of the test and measurement devices 110 has associated with it a particular triggering characteristic defined by respective triggering elements therein (e.g., trigger circuit 109, event decoder 111, optional trigger logic unit 117). When the internal triggering conditions of a test and measurement device 110 are satisfied, a corresponding trigger enable signal TE is provided to the external trigger controller 120. When all of the relevant test and measurement devices 110 provide or assert their respective trigger enable signals (e.g., $TE_1$ through $TE_N$), the external trigger controller 120 provides a trigger control signal $T_C$ to each of these test and measurement instruments 110.

In response to reception of the external trigger control signal $T_C$, each test and measurement instrument 110 continues to acquire an acquisition record according to a post-trigger count. That is, for a post-trigger count period (defined in terms of the pulses of a counter, time increments and the like), each test and measurement instrument 110 continues to build its respective acquisition record. Upon the conclusion of its post-trigger count period, the test and measurement instrument 110 stops building its respective acquisition record. The acquisition records are then processed by, for example, an interleaving processing operation to form a combined acquisition record.

The first time line 310 depicts a plurality of events $310_1$ through $310_7$. Each of the events $310_1$ through $310_7$ comprises a combined triggering event.

The second time line 320 depicts the assertion $320_1$ of the trigger enable signal $TE_1$ produced by a first test and measurement instrument $110_1$. The third time line 330 depicts the assertion $330_1$ of the trigger enable signal $TE_2$ produced by a second test and measurement instrument $110_2$. The fourth time line 340 depicts the assertion $340_1$ of the trigger enable signal $TE_3$ produced by a third test and measurement instrument $110_3$. The fifth time line 350 depicts the assertion $350_1$ of a trigger control signal $T_C$ produced by the trigger controller 120 in response to the three trigger enable signals $TE_1$ through $TE_3$ (assuming N=3).

Each of the acquisition units 113 within the test and measurement instruments 110 continually builds an acquisition record in response to received data. Given that each acquisition unit 113 contains a finite amount of memory, the acquisition record being constructed necessarily overwrites previous acquisitions in, for example, a circular buffer operation. However, in response to the assertion of a trigger control signal $T_C$ (e.g., assertion $350_1$), the construction of an acquisition record is terminated at the conclusion of a post-trigger count.

In the embodiment of FIG. 3, the amount of time for a first signal acquisition device $110_1$, is the difference between the start $372_1$ and end $376_1$ time period defined by the first post-trigger count period $370_1$. Similarly, a second acquisition record $360_2$ is constructed for the acquisition unit 113 of the second test and measurement device $110_2$. Construction of the second acquisition record $360_2$ is terminated in response to the expiration of a second post-trigger count period $370_2$, which post-trigger count period is defined by a start $372_2$ and end $376_2$. The start time $372_2$ is defined by the trigger control signal TC, the end time $376_2$ is defined in the above-described manner based on, for example, the memory size available in the device. Construction of a third acquisition record $360_3$ is terminated in response to the expiration of a third post-trigger count period $370_3$, which post-trigger count period is defined by a start time $372_3$ and end time $376_3$. The start time $372_3$ is defined by the trigger control signal TC, the end time $376_3$ is defined in the above-described manner based on, for example, the memory size available in the device.

Figure 4:
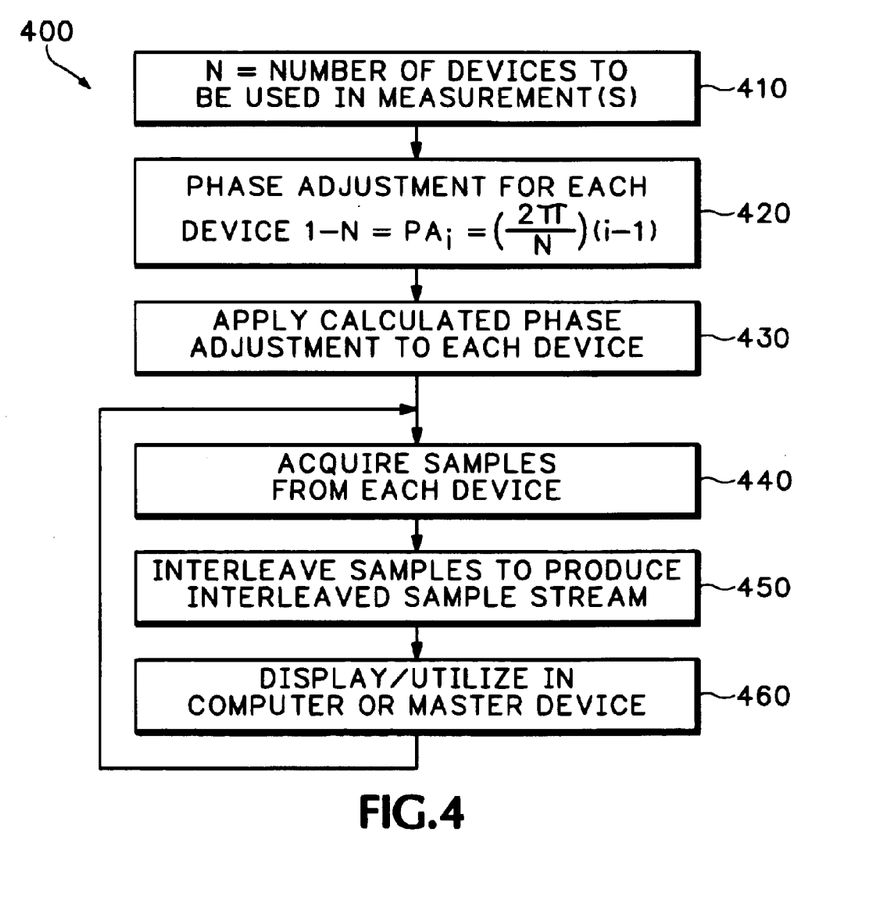
FIG. 4 depicts a flow diagram of a method according to an embodiment of the present invention.

FIG. 4 depicts a flow diagram of a method according to an embodiment of the present invention. Specifically, the method 400 of FIG. 4 depicts various steps implemented by hardware and/or software components within a controller of a master signal acquisition device or computing device controlling a plurality of signal acquisition devices.

At step 410, the number N of devices to be used in a system for performing measurements is determined. That is, in one embodiment, at step 410 a number of signal acquisition devices 110 in the system 100 of FIG. 1 is determined. At step 420, a phase adjustment for each of the N devices is determined as follows: $PA_i=(2\pi/N)(i-1)$, where i is the device number 1 through N. Thus, in the case of N=4 (i.e., four test and measurement instruments 110), the phase adjustment of the first device (i=1) is 0, the phase adjustment of the second device (i=2) is $\pi/2$, the phase adjustment of the third device (i=3) is $\pi$ and the phase adjustment of the fourth device (i=4) is $3\pi/2$.

At step 430, the calculated phase adjustment for each device is applied. That is, at step 430 the phase adjustable oscillation source 119PA is adjusted by the respective phase adjustment by, for example, the control signal PC provided by the controller 115. Optionally, a phase adjustment information may be provided via a master test and measurement device or a computing device via, for example, a communications bus. In either event, the phase adjustment of the second through N test and measurement devices 110 is adjusted by the appropriate amount to enable subsequent interleaving of the acquired data samples from the various devices.

At step 440, samples are acquired from each device. At step 450, the acquired samples are interleaved to produce an interleaved sample stream. At step 460, the interleaved sample stream is displayed and/or utilized by a computer or master device.

Steps 440 through 460 are continually repeated to provide a continuous interleaved sample stream for display and/or other utilization.

Figure 5:
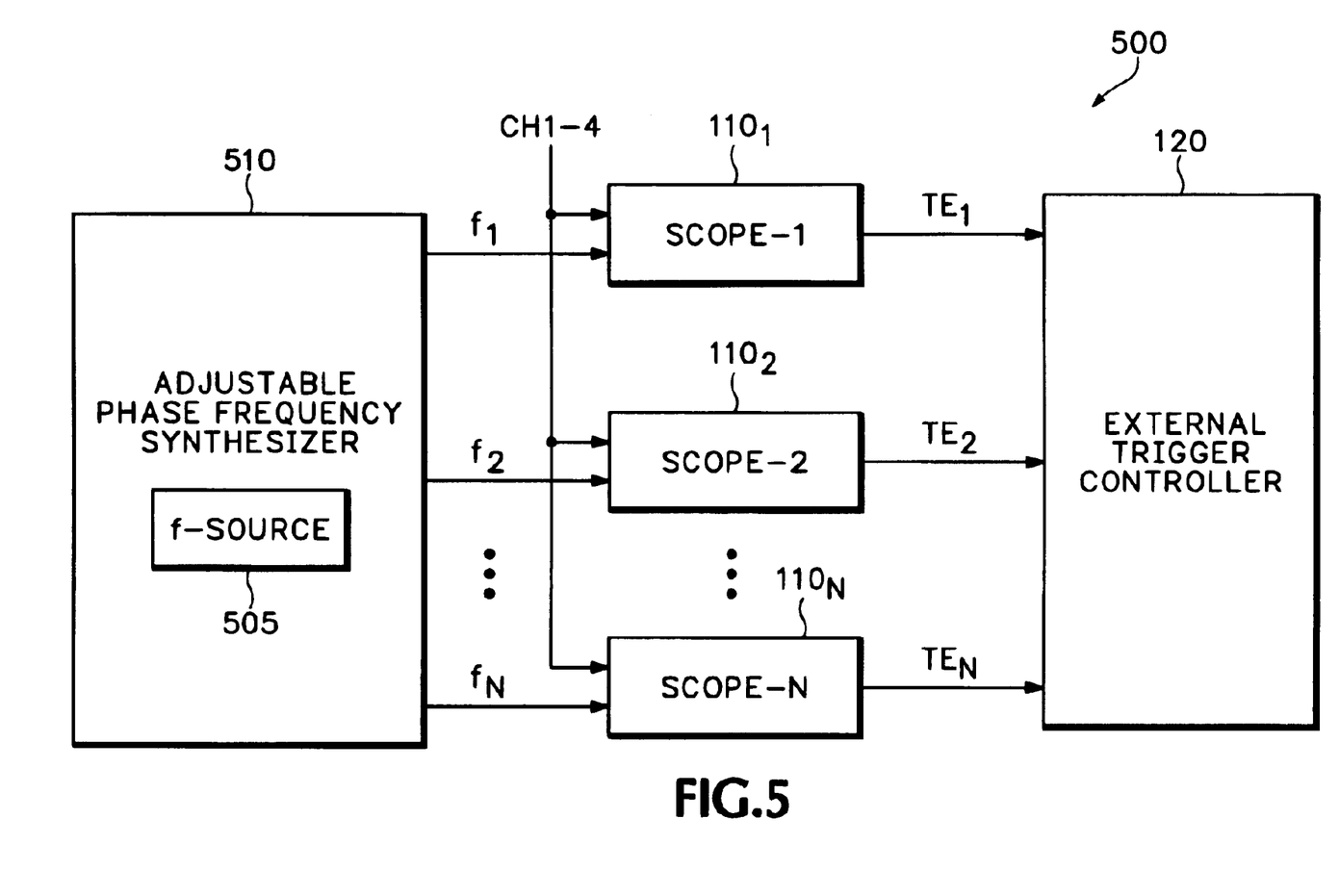
FIG. 5 depicts a high level block diagram of a signal analysis system according to an embodiment of the invention To facilitate understanding, identical reference numerals have been used, where possible, to designate identical elements that are common to the figures.

FIG. 5 depicts a high level block diagram of a signal analysis system according to an embodiment of the invention. Specifically, the signal analysis system 500 of FIG. 5 operates in substantially the same manner as described above with respect to the system 100 of FIG. 1. As such, only differences between the two systems will be described in more detail.

The difference between the systems is the inclusion within the system 500 of FIG. 5 of an adjustable phase frequency synthesizer 510 and an associated frequency source 505. In the system 100 of FIG. 1, each of the acquisition devices 110 includes a phase adjustable VCO which enables the establishment of a precise sampling clock rate. The phase shift among the sampling clocks of the acquisition devices 110 is adjusted via the respective phase adjustable VCO such that the spacing of data samples is (preferably) equalized in time. Moreover, the external reference OUT signal provided by each acquisition device 110 is used to propagate a reference timing signal to a next acquisition device.

In the system 500 of FIG. 5, an external frequency synthesizer (or plurality of external frequency synthesizers) 510 is used to control the phase of sampling clocks in several acquisition devices. Specifically, the adjustable phase frequency synthesizer 510 produces a plurality of common clock signals denoted as frequencies $f_1$ through $f_N$ which are coupled to, respectively, signal acquisition devices $110_1$ through $110_N$. While the clock signal frequencies are the same, the phases of the clock signals $f_1$–$f_N$ are offset in time to achieve, preferably, an equalized spacing of acquired data points. In this manner, the phase offset sampling and interleaved data acquisition discussed above with respect to FIGS. 1–4 is achieved in the system 500 of FIG. 5.

In one embodiment of the invention, each of a plurality of digital storage oscilloscopes (DSOs) is operatively coupled together to form a test and measurement system in which one or more input signals is processed by each DSO. Each DSO acquires data according to a respective clock signal having a common frequency parameter and respective phase parameter. Data acquisition is also synchronized using a common trigger signal. Each DSO acquires data for a predetermined time period measured by a post-trigger count to assemble thereby a respective acquisition record. A master or primary DSO combines the primary DSO acquisition records and non-primary DSO acquisition records to form thereby an interleaved acquisition record, which acquisition record may be displayed or further processed by the primary DSO or a test and measurement work station.

In one embodiment of the invention, the phase controllers of the various acquisition devices are controlled such that the phase parameters at the beginning and/or end of an acquisition record are synchronized, thereby avoiding a "broken" sample at the beginning or end of an acquisition record. In this manner, transition between acquisition records is substantially seamless.

While the foregoing is directed to the preferred embodiment of the present invention, other and further embodiments of the invention may be devised without departing from the basic scope thereof, and the scope thereof is determined by the claims that follow.

What is claimed is:

1. A test and measurement system, comprising:
   a plurality of signal acquisition devices acquiring a common signal under test;
   each of said signal acquisition devices acquiring said SUT at a first sample rate in response to a common trigger signal and a respective clock signal;
   each respective clock signal having a common frequency parameter and a respective phase parameter;
   said sample streams being merged to produce a combined sample stream having an effective sample rate greater than said first sample rate.

2. The system of claim 1, wherein said signal acquisition devices comprise digital storage oscilloscopes (DSOs).

3. The system of claim 1, wherein:
   each of said signal acquisition devices provides a trigger enable signal in response to said SUT exhibiting a predefined behavior; said system further comprising:

a trigger combiner, for logically combining said trigger enable signals to produce thereby said common trigger signal.

4. The system of claim 3, wherein said common trigger signal is asserted by said trigger combiner in response to an assertion of each of said trigger enable signals.

5. The system of claim 1, further comprising:

a display device, for displaying said combined sample stream.

6. The system of claim 1, wherein:

said plurality of signal acquisition devices comprises a primary signal acquisition device and at least one non-primary acquisition device, said primary signal acquisition device operatively coupled to said at least one non-primary signal acquisition device to receive therefrom at least one sample stream;

said primary signal acquisition device combining said sample streams to produce said combined sample stream.

7. The system of claim 6, wherein said primary signal acquisition device cooperates with a display device to display said combined sample stream.

8. The system of claim 1, further comprising:

a frequency synthesizer, for generating said respective clock signals.

9. The system of claim 1, wherein:

said plurality of signal acquisition devices comprises N signal acquisition devices, where N is an integer greater than one;

a first signal acquisition device provides a reference clock signal at an output;

each of the N−1 remaining signal acquisition devices receives a respective reference clock signal at an input from a preceding signal acquisition device, and responsively provides a respective reference clock signal at an output to a subsequent signal acquisition device;

said clock signals having offset phase parameters.

10. The system of claim 1, wherein each of said clock signal phases is offset from the phase of an adjoining clock signal by $2\pi/N$.

11. The system of claim 10, wherein said plurality of signal acquisition devices comprises N signal acquisition devices, where N is an integer greater than 1; and wherein each of said clock signal phases is offset from the phase of an adjoining clock signal by $2\pi/2$.

12. The system of claim 1, wherein:

each of said N signal acquisition devices stores a respective acquisition record comprising those samples produced within a time period defined by said common trigger signal and a respective post-trigger count.

13. A method adapted for use in a system comprising N signal acquisition devices receiving at least one common signal under test (SUT) where N is an integer greater than one, said method comprising:

digitizing said SUT using a respective phase staggered analog to digital (AD) converter within each signal acquisition device to produce N streams of samples; and combining said N sample streams in a temporally aligned manner to produce a combined sample stream.

14. The method of claim 13, wherein each of said AD converters produces samples in response to an edge of a respective clock signal, each of said respective clock signals having a common frequency and unique phase.

15. The method of claim 14, wherein each of said clock signal phases is offset from the phase of an adjoining clock signal by $2\pi/N$.

16. The method of claim 14, wherein N is equal to four and each clock signal is offset from the phase of an adjoining clock signal by $\pi/2$.

17. The method of claim 13, further comprising:

storing each acquired sample in said N streams of samples to form N acquisition records.

18. The method of claim 17, wherein each of said N acquisition records comprises those respective samples produced within a time period defined by a common trigger signal and a respective post-trigger count period.

* * * * *